(12) United States Patent
Tsui et al.

(10) Patent No.: US 7,486,092 B2
(45) Date of Patent: Feb. 3, 2009

(54) APPARATUS FOR SUPPORTING SEMICONDUCTOR DEVICES DURING TESTING

(75) Inventors: Ching Man Tsui, Hong Kong (CN);
Lap Kei Chow, Hong Kong (CN); Hui Fai Ho, Hong Kong (CN); Cam Nguyen Ronald Ngo, Hong Kong (CN)

(73) Assignee: ASM Assembly Automation Limited, Kwai Chung (HK)

( * ) Notice: Subject to any disclaimer, the term of this patent is extended or adjusted under 35 U.S.C. 154(b) by 0 days.

(21) Appl. No.: 10/829,431

(22) Filed: Apr. 22, 2004

(65) Prior Publication Data

US 2004/0195665 A1 Oct. 7, 2004

Related U.S. Application Data

(62) Division of application No. 09/888,571, filed on Jun. 26, 2001, now Pat. No. 6,783,316.

(51) Int. Cl.
*G01R 31/02* (2006.01)
(52) U.S. Cl. ........................ 324/765; 324/755
(58) Field of Classification Search ......... 324/754–765; 438/14–17; 439/62–72; 257/686–688; 174/260; 269/286
See application file for complete search history.

(56) References Cited

U.S. PATENT DOCUMENTS 3,560,849 A * 2/1971 Ryan et al. ................. 324/419
3,761,808 A * 9/1973 Ryan .......................... 324/537
3,961,415 A * 6/1976 Davis, Jr. .................... 438/125
4,763,409 A * 8/1988 Takekawa et al. ............. 29/827
4,833,402 A * 5/1989 Boegh-Petersen ........... 324/754
5,008,615 A 4/1991 Littlebury
5,121,053 A * 6/1992 Shreeve et al. .............. 324/754
5,189,363 A * 2/1993 Bregman et al. ............. 324/754
5,227,717 A * 7/1993 Tsurishima et al. ......... 324/754
5,440,231 A 8/1995 Sugai
5,897,290 A 4/1999 Lu et al.
5,975,835 A 11/1999 Mochida et al.
5,990,692 A * 11/1999 Jeong et al. ................. 324/755
6,045,318 A 4/2000 Mochida et al.
6,170,676 B1 * 1/2001 Patadia et al. .............. 211/41.6
6,407,566 B1 * 6/2002 Brunelle et al. ............. 324/758
6,507,185 B1 1/2003 Hennekes et al.

* cited by examiner

*Primary Examiner*—Vinh P Nguyen
(74) *Attorney, Agent, or Firm*—Buchanan Ingersoll & Rooney, PC (57) ABSTRACT

An apparatus supports, during a testing operation, a leadframe formed with at least one row of non-singulated semiconductor devices. The apparatus includes a main body and a leadframe support member, and the leadframe support is formed with at least one groove for receiving semiconductor devices such that in use leads extending from the semiconductor devices lie on a surface of the support member.

17 Claims, 9 Drawing Sheets

CROSS SECTION A-A

CROSS SECTION B-B

APPARATUS FOR SUPPORTING SEMICONDUCTOR DEVICES DURING TESTING

This Application is a DIV. of application Ser. No. 09/888,571, filed on Jun. 26, 2001, now U.S. Pat. No. 6,783,316.

FIELD OF THE INVENTION

This invention relates to an apparatus and method for the testing of semiconductor devices, and in particular to the testing of such devices when attached to a leadframe and before they are formed.

BACKGROUND OF THE INVENTION

Semiconductor circuits are initially manufactured as wafers. A circular wafer of a semiconductor material such as silicon is formed with a plurality of individual circuits each of which is called a die (pl. dice). After the dice are formed on the wafer, the wafer is cut so as to separate the dice from each other and each die is then assembled into a semiconductor package with bond wires connecting the bond pads of a die with the pins of the package. A number of tests on the dice are carried out at various stages in the process. In particular, for example, a test of the devices while they are still part of the wafer is carried out. This test is known as a wafer test and is used to discard dies that have been incorrectly formed.

Once the die is assembled in a package it is tested again to ensure that the package has been properly assembled and that no damage has occurred to the die during the assembly and processing and to verify that the device still meets its design specifications. This test may be carried out at several different temperatures to check parameters that may be temperature sensitive. For example commercial devices may be tested at 0° C., 25° C. and 70° C. Devices intended for military applications may be tested at more extreme temperatures still, for example −55° C., 25° C. and 125° C.

In summary, the testing of semiconductor devices is an important part of the manufacturing process, and in order to prevent the processing time being seriously delayed, methods and apparatus need to be designed that facilitate the testing of such semiconductor devices in the most time-efficient and reliable manner possible.

PRIOR ART

When the dies are assembled into semiconductor packages, the packages are conventionally formed as part of what is called a leadframe. In the past a leadframe may include a single row of semiconductor packages, more recently however leadframes may include two or more rows of packages such that the semiconductor packages are arranged in an array. When they are attached to the leadframe, the packages are electrically isolated from each other and are physically connected to the leadframe by one or more tie bars. In this condition the devices are conventionally referred to as being non-singulated semiconductor devices.

A difficulty in testing devices in a non-singulated condition is that as semiconductor devices are becoming small and thinner than before, the leadframe is therefore correspondingly becoming thinner. A relatively thin leadframe supporting a densely packed array of thin semiconductor devices is fairly pliant and can be susceptible to buckling and potential damage. It is therefore important to handle the leadframe carefully during any testing procedure.

A number of prior proposals exist for the testing of such non-singulated semiconductor devices. One example is shown in U.S. Pat. No. 5,008,615 (Littlebury). In this apparatus and method, however, although the devices are non-singulated, they are nonetheless partially formed in the sense that the leads extending from the package are trimmed and are then bent downwardly (ie out of the plane of the leadframe) so as to contact a test head.

Another example of the prior art is shown in U.S. Pat. No. 5,440,231 (Sugai). In this arrangement a leadframe bearing non-singulated semiconductor devices is lowered onto a test fixture. While this arrangement does not require the devices to be partially formed, nevertheless the test fixture has a complex cantilevered and test lead structure for bringing the test fixture contact heads into contact with the leads of the packaged device. However, this apparatus can only test a single packaged semiconductor device at a time. In this arrangement a conductive traces board or printed board is located under the test fixture (test lead) while a loadboard is placed under the conductive traces board. This is to shorten the connection between the DUT (Device Under Test) the probe. This type of layout will require a lot of space therefore, and this makes it difficult to implement multiple and simultaneous test in a strip. Also known in the prior art is related patent U.S. Pat. No. 5,961,650.

SUMMARY OF THE INVENTION

According to the present invention there is provided apparatus for supporting during a testing operation a leadframe formed with at least one row of non-singulated semiconductor devices, comprising a main body and a leadframe support member, wherein said leadframe support member is formed with at least one groove for receiving said semiconductor devices such that in use leads extending from said devices lie on a surface of said support member.

Preferably the leadframe support member may be formed with a plurality of parallel grooves to enable the support member to support one or more strips of devices.

In a preferred embodiment the apparatus may comprise means for releasably gripping a leadframe so as to hold the leadframe in place. This gripping means may comprise a pair of gripping members disposed on respective sides of the groove, and means may be provided for moving the gripping members into and out of engagement with a leadframe. The moving means may be actuated a compressed air. A plurality of pairs of gripping members may be provided, and the compressed air is provided directly to one pair and is distributed to the other pairs by an air distribution assembly formed in the main body.

The main body is preferably formed of a conducting material and is provided with means for electrically grounding the main body. The leadframe support member is preferably formed of a high resistivity electrically insulating material.

Viewed from another aspect the present invention provides apparatus for testing non-singulated semiconductor devices formed on a leadframe with unformed leads extending from said devices, comprising:

(a) carrier means for carrying said leadframe,
(b) a loading position at which a leadframe is loaded on a said carrier,
(c) means for transporting a loaded said carrier to and from a testing means,
(d) means for supporting said leads during a testing operation,
(e) means for removing said leadframe from said carrier after testing, and (f) means for returning an unloaded said carrier to said leadframe loading position.

The transporting means preferably transports the carrier in a first horizontal direction, and the returning means comprises means for transporting an unloaded carrier in a direction opposite to the first direction and at a height below the first direction. The loading station is at the same height as said returning means and means are provided for elevating a loaded carrier to the transporting means. Means may be provided for receiving a carrier at the end of the transporting means and for lowering a carrier to the returning means.

Viewed from a still further aspect the present invention provides a method for testing non-singulated semiconductor devices having unformed leads extending therefrom and being formed on a leadframe, comprising locating said leadframe on a support surface of a carrier such that said leads lie flat on said support surface, transporting said carrier to a testing means, testing said devices while said leads remain flat on said surface, transporting said carrier away from said testing means, and removing said leadframe.

BRIEF DESCRIPTION OF THE DRAWINGS

An embodiment of the invention will now be described by way of example and with reference to the accompanying drawings, in which.

DETAILED DESCRIPTION OF PREFERRED EMBODIMENT

Figure 1:
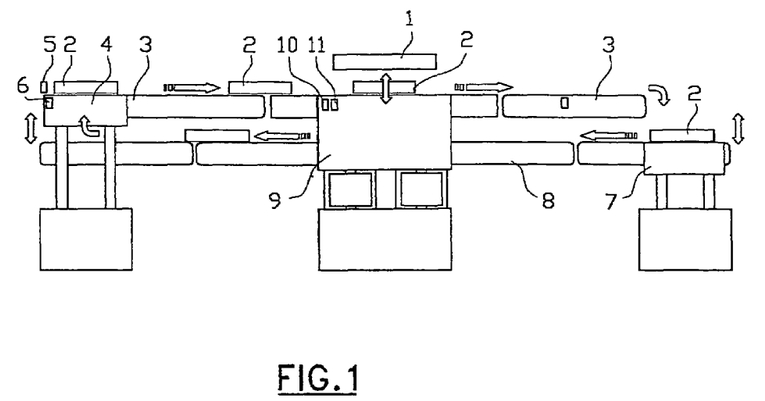
FIG. 1 is a side view of an apparatus according to a first embodiment of the invention and showing a test cycle.

Referring firstly to FIG. 1 there is shown an apparatus according to a first embodiment of the invention. The apparatus includes a test probe head 1 for testing a plurality of non-singulated semiconductor devices still attached to one or more leadframes. As will be explained further below, the precise form of the test probe head may vary, and will in particular depend on the configuration of devices attached to the leadframe(s). The leadframe(s) are supported on a leadframe carrier 2 and a plurality of such leadframe carriers 2 pass through the apparatus on a conveyor 3.

In FIG. 1 the conveyor 3 is arranged to move the carriers 2 from left to right towards the test probe head 1. The carriers 2 are introduced onto the conveyor 3 by means of an input elevator 4 that receives the carriers 2 bearing the leadframe(s). Any conventional trim and form loading apparatus can be coupled to the apparatus of the present invention. Such a machine will ensure that the leadframes are correctly loaded on the carrier and that all the leads are cut and are of the correct number before being fed into the test process. As will be explained further below a single carrier 2 may carry one or more leadframes. The input elevator 4 raises the carrier 2 until it is at the same level as the conveyor 3. A kicker 5 then functions to transfer a carrier 2 from the elevator 4 onto the conveyor 3. The carrier 2 may be provided with electronically readable carrier identification means 91 which may be read by a reader 6 located adjacent the kicker 5 such that the reader 6 may then send a signal to a control means (not shown) to indicate that a particular carrier is entering the apparatus. The identification means 91 may, for example, include information regarding the number of leadframes on the carrier 2 and the configuration of the semiconductor devices that is supplied to the test probe head 1 so that when the carrier 2 reaches the test probe head 1 an appropriate test probe configuration is selected for testing the devices on that particular carrier 2.

Once a carrier 2 has been moved onto conveyor 3 it is transported towards the test probe head 1 (ie from left to right in FIG. 1) where the carrier 2 is stopped and semiconductor devices thereon are subject to a test operation in a manner to be described in further detail below. The testing process may involve "soft docking" in which the test probes are remote from the test probe head and connected thereto by cables. The cables introduce electrical resistance and so the response time is slow. The alternative approach is to use a "direct docking" process in which the test probes are located very close to the test probe head. Direct docking techniques are faster and allow a greater throughput of devices under test. The present invention may be employed with a test probe head that uses either soft or direct docking. After the test operation has been completed, the carrier 2 is moved once more by conveyor 3 to the right in FIG. 1 away from the test probe head 1 towards an output elevator 7. The output elevator 7 is initially at a height such that its upper surface is continuous with the conveyor 3. A carrier 2 is transferred from the conveyor 3 to the output elevator 7 when it reaches the end of the conveyor 3, and the output elevator 7 is then lowered to the height of a return conveyor 8 that lies beneath conveyor 3 and which functions to transfer carrier 2 back towards the input elevator 4 for a repeat of the above operation. It will be understood that after a carrier has passed through the test probe head the leadframe (s) on the carrier are removed (by means not shown) for further processing. Semiconductor packages that have failed the test may be marked for subsequent removal by any conventional technique. Alternatively, however, if a test has been inconclusive, the leadframe(s) may be allowed to remain on the carrier 3 and may be returned with the carrier on return conveyor 8 for the test operation to be repeated.

FIGS. 2 to 5 show in more detail a carrier 2 in accordance with a preferred embodiment of the invention. In particular, the carrier 2 comprises a main body 20 and a leadframe support member 21. Leadframe support member 21 is located within a recess formed in the main body 20 and when so located forms the main part of the upper surface of carrier 2. Both the main body 20 and the leadframe support member 21 have a generally rectangular configuration with a main axis extending along the direction of movement of the carrier along conveyor 3. The leadframe support member 21 is formed with at least one groove 22 extending the length of the leadframe support member and along the main axis. The groove 22 is sized so as to receive within the groove the semiconductor devices formed with a leadframe to be supported on the carrier 2. Preferably the support member is provided with a plurality of such grooves 22 (for example four such grooves are shown in the illustrated embodiment) such that the carrier 2 may support a leadframe that has more than one row of semiconductor devices, or may support multiple single row leadframes, or even a combination of the two. It will be appreciated that the size and number of grooves 22 formed on the leadframe support member 21 may be chosen dependent on the leadframes that the member 21 is designed to support. It will also be understood that different carriers 2 may be provided with different leadframe support members with different groove configurations designed for different leadframes and leadframe combinations.

Figure 10:
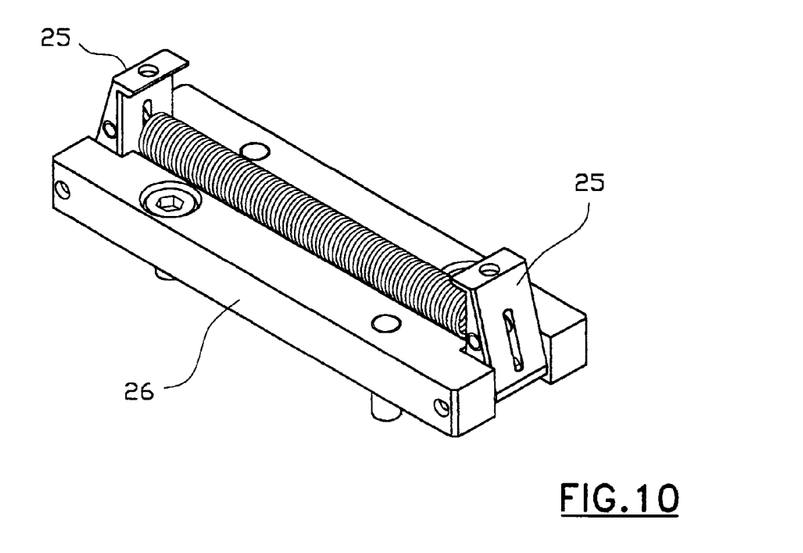
FIG. 10 is a perspective view of a gripper assembly.
Figure 11:
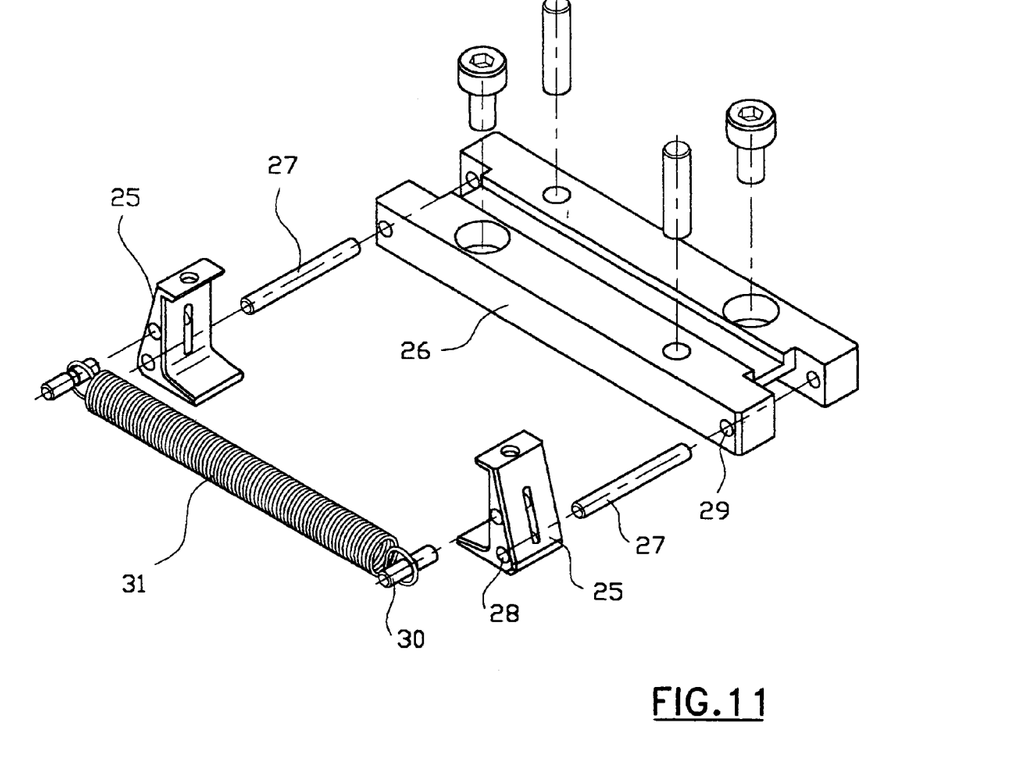
FIG. 11 is an exploded perspective view of the gripper assembly of FIG. 10.
Figure 12:
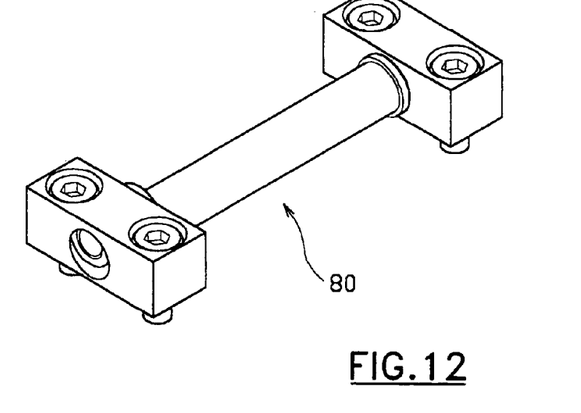
FIG. 12 is a perspective view of a coupler assembly.
Figure 13:
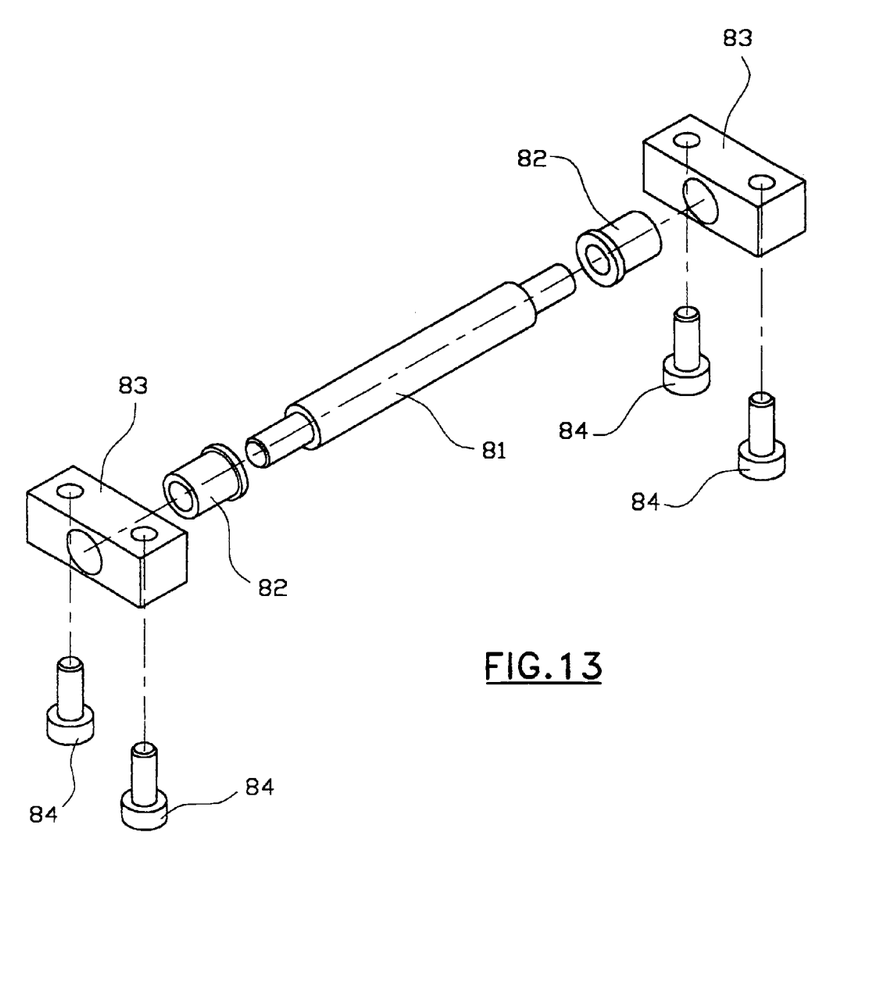
FIG. 13 is an exploded perspective view of the coupler assembly of FIG. 12.

Provided at three locations along the principal axis of the carrier 2 are spring-biased leadframe gripping means 23 that extend through apertures 24 provided in the support member 21. Each leadframe gripping means 23 is identical to the others, and so only one will be described with reference not only to FIGS. 2 and 3, but also in particular to FIGS. 10 and 11. Each gripping means 23 comprises a pair of gripping members 25 that are pivotally mounted to gripping holder 26 by means of hinge pins 27 that extend through holes 28 formed in the gripping members 25 and holes 29 formed in the gripping holder 26. Each gripping member 25 is also formed with a transverse cross-pin 30 and an extension spring 31 connects the two respective cross-pins 30 formed in the respective gripping members 25. Extension spring 31 ensures that the gripping members 25 are spring-biased towards each other. In use the gripping members 25 extend through the apertures 24 to engage and hold the leadframe(s) provided on the support member 21.

Figure 2:
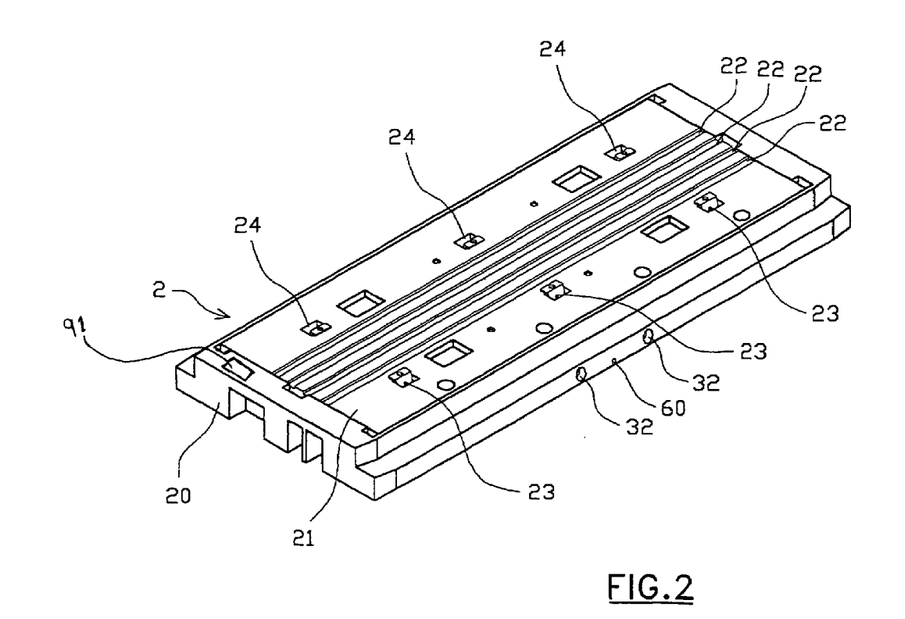
FIG. 2 is a perspective view of a leadframe carrier in accordance with an embodiment of the invention.
Figure 3:
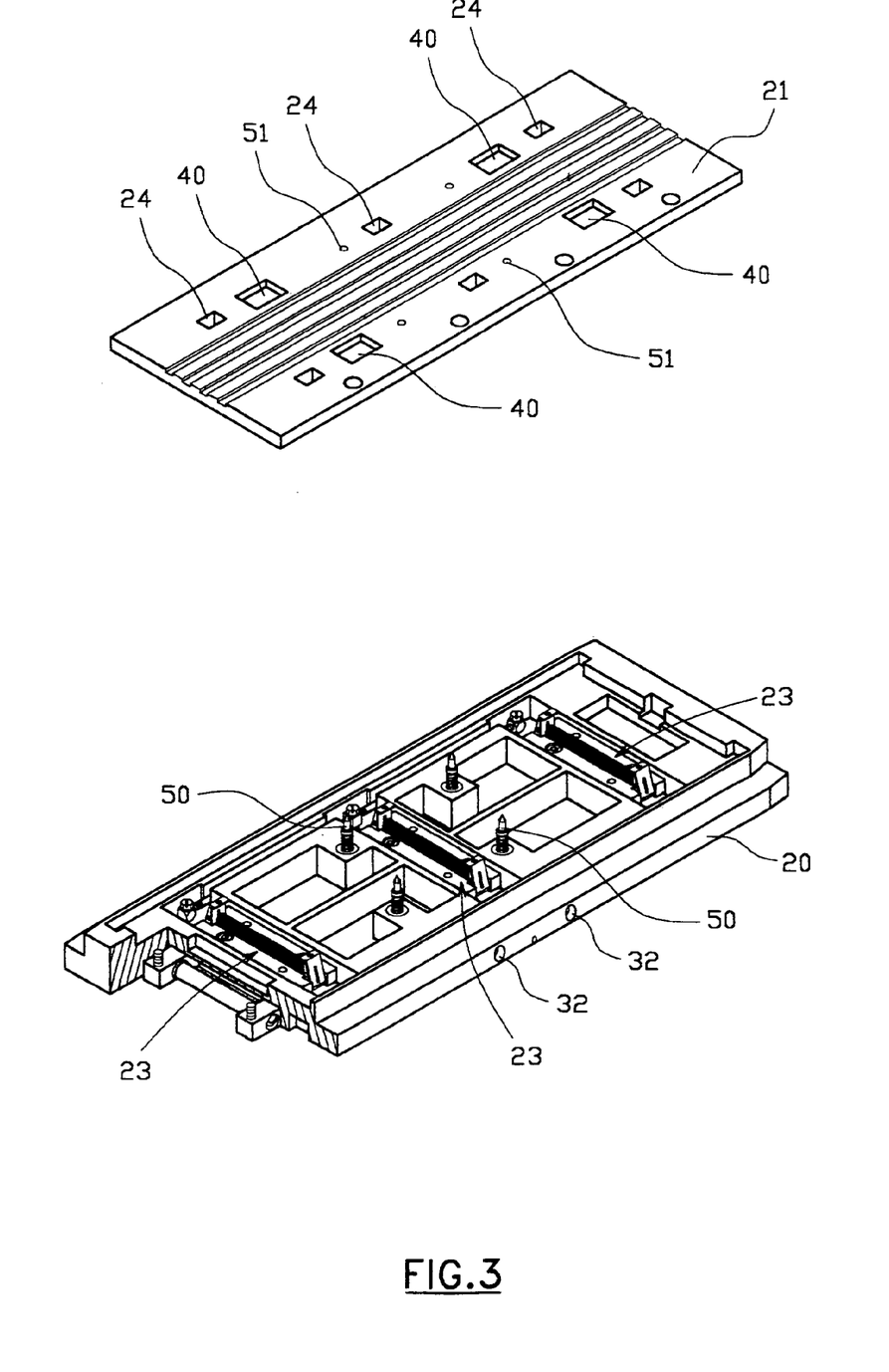
FIG. 3 is a perspective view of the leadframe carrier of FIG. 2 with the leadframe supporting member removed.
Figure 4:
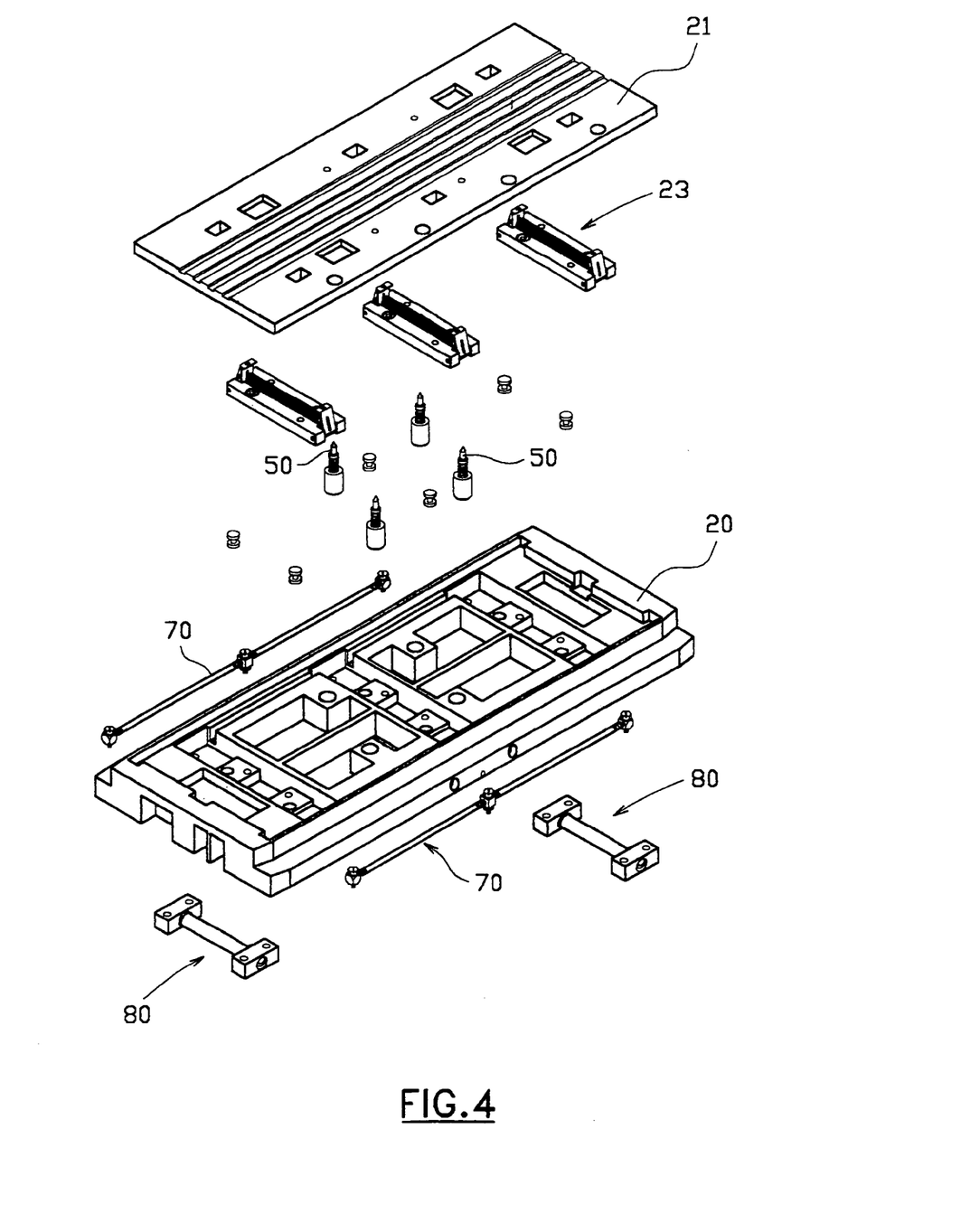
FIG. 4 is an exploded perspective view of the leadframe carrier of FIG. 2.
Figure 5:
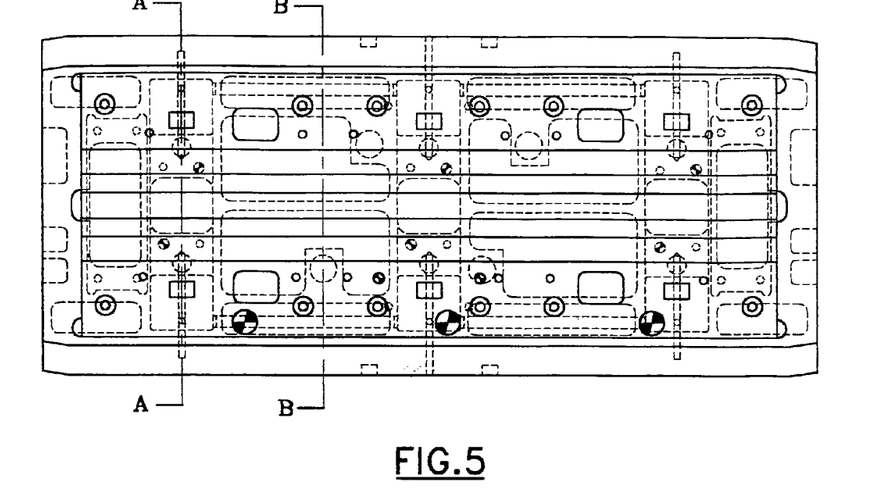
FIG. 5 is a plan view of the leadframe carrier of FIG. 2.

Pivoting movement of the gripping members 25 to alternately grip and release leadframe(s) is achieved by means of a compressed air supply. Referring in particular to FIG. 2, a compressed air inlet 60 is provided on each side of the main body 20 at a half-way point therealong. The position of the air inlet 60 corresponds to the middle of the three gripping means 23. Although compressed air is only supplied to one air inlet 60 on either side of the main body 20, compressed air is also directed to the locations of the other two gripping means 23 by virtue of an air distribution assembly 70 as shown in particular in FIGS. 14 and 15. One air distribution assembly 70 is provided on each side of the main body 20 and they are identical and thus only one will be described. By providing a single air inlet with an internal distribution assembly, the air inlet is is universal to any leadframe configuration and will not need to be changed with the leadframe configuration.

Figure 6:
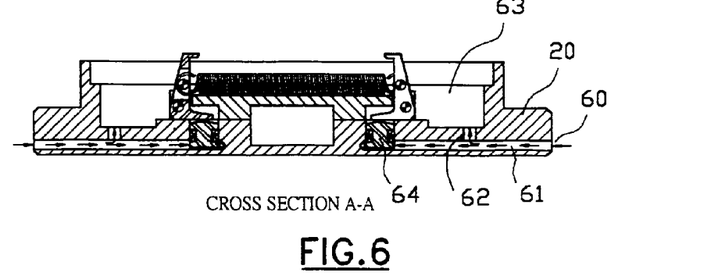
FIG. 6 is a cross-section along line A-A of FIG. 5.
Figure 7:
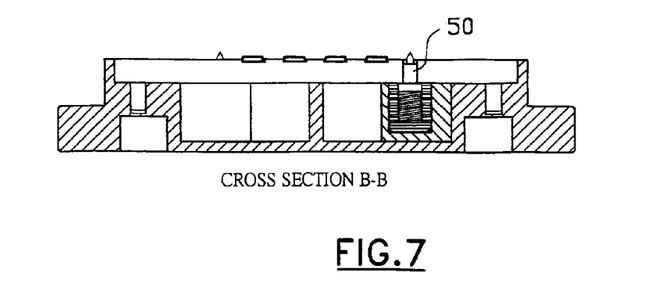
FIG. 7 is a cross-section along line B-B of FIG. 5.
Figure 8:
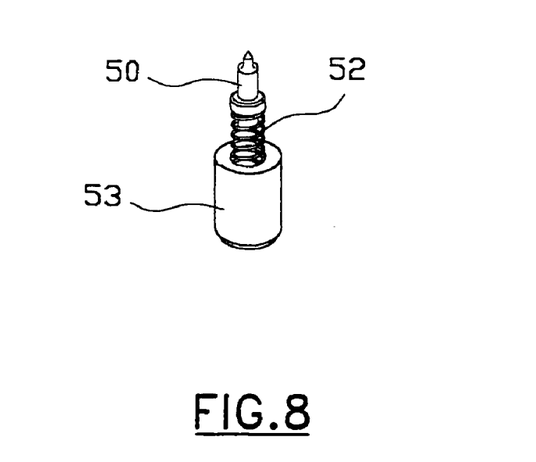
FIG. 8 is a perspective view of a location pin assembly.
Figure 9:
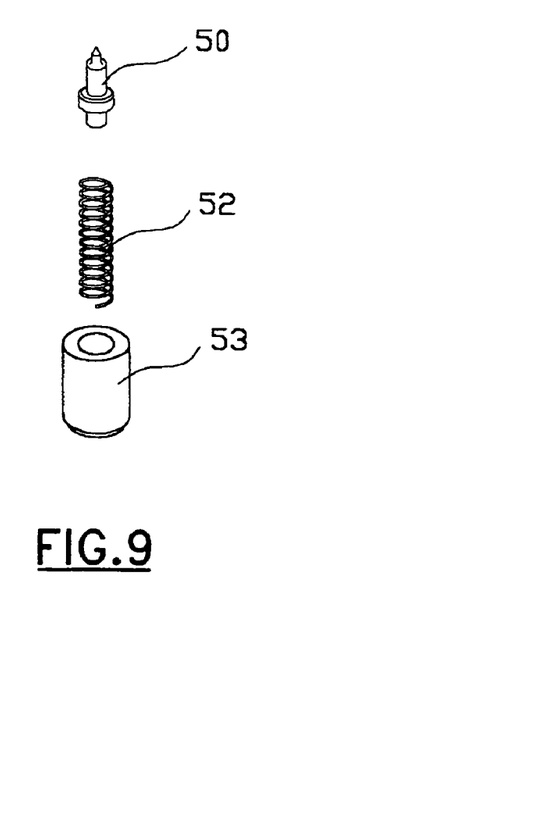
FIG. 9 is an exploded perspective view of the location pin assembly of FIG. 8.
Figure 14:
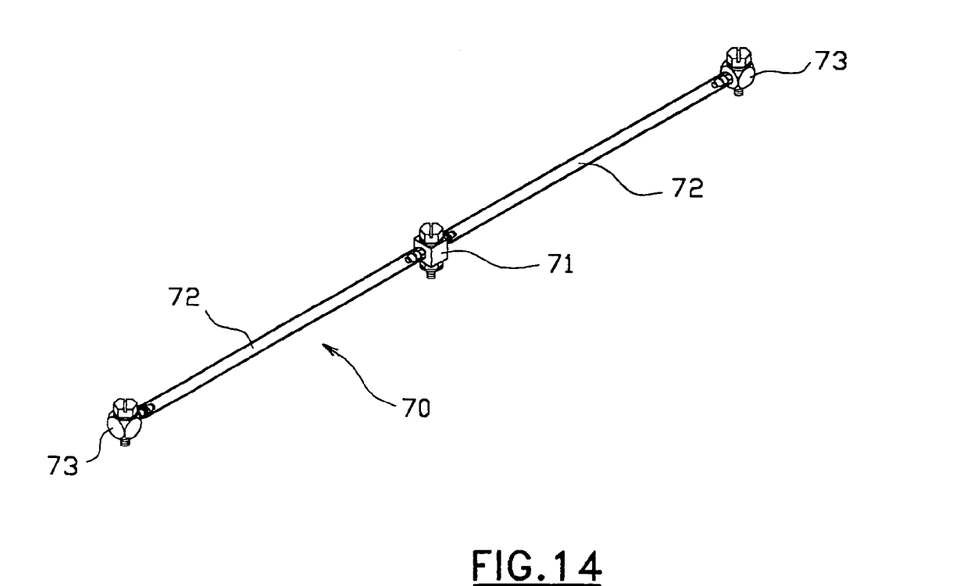
FIG. 14 is a perspective view of an air distribution assembly.
Figure 15:
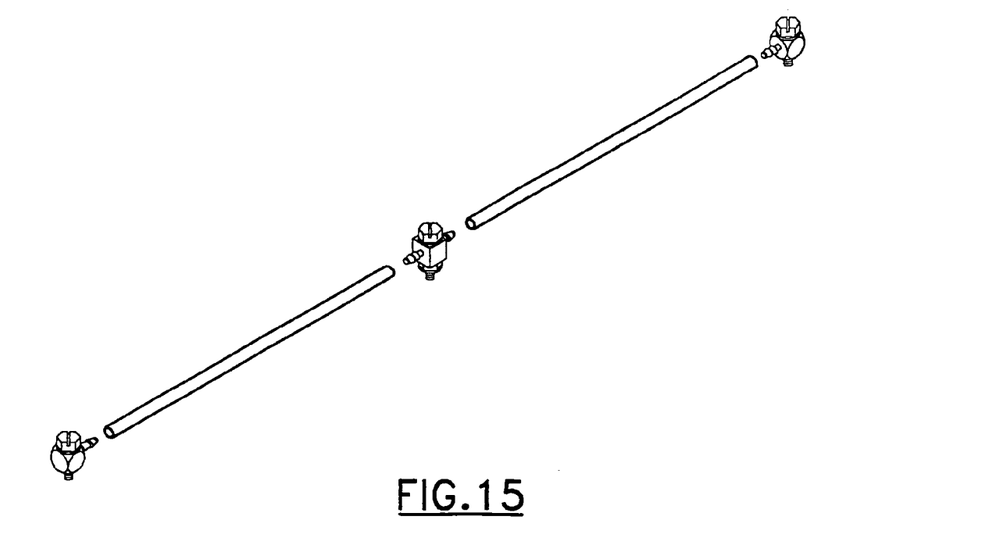
FIG. 15 is an exploded perspective view of the air distribution assembly of FIG. 14.

Air distribution assembly 70 comprises a central T-joint 71 that connects to two polyurethane tubes 72 that lead to one-way joints 73. Referring to FIG. 6, the central T-joint 71 is received within an air distribution chamber 63 provided in the main body 20 adjacent the central of the three gripping means. Compressed air is supplied through inlet 60 to a first bore 61 that leads to the gripping means 23 to allow the compressed air to act thereon through a piston 64. A second bore 62 leads vertically off first bore 61 to the air distribution chamber 63 and a lower joint of the T-joint may be threadedly connected to the second bore 62. Thus part of the compressed air passes to the T-joint 71 and then through tubes 72 to the one-way joints 73 that are located in corresponding air distribution chambers 63 provided adjacent the other two gripping means 23. Thus compressed air supplied to the air inlet 60 is able to act directly on the central gripping means 23 through piston 64, and in addition may be directed to the other two gripping means 23 by the air distribution assembly 70.

The leadframe support member 21 is also provided with four apertures 40, two on either side located between apertures 24, sized to provide space for a leadframe pick and place tool that is used to place leadframes on the support member 21 before testing and to subsequently remove leadframes from the support member 21 after testing has been completed.

Referring in particular to FIGS. 2,3,4,7,8 and 9, the main body 20 of the leadframe carrier 3 is provided with four location pins 50 that locate in apertures 51 formed in the leadframe support member 21. It should be noted that although two location pins 50 and corresponding apertures 51 are provided on either side of the grooves 22, they are asymmetrically located such that the leadframe support member 21 can only fit on the main body 20 in one position. It should also be noted, as shown in particular in FIGS. 8 and 9, that the location pins 50 are spring mounted by springs 52 in isolation bushes 53 which in turn are received within bores formed in the main body 20. Isolation bushes 53 insulate the pins from any electrical connection to the main body 20. The location pins 50 are partially depressed when received in the apertures 51 of correctly located leadframe support members, but are completely depressed when a leadframe support member 21 is incorrectly located on the main body 20.

Referring now to FIGS. 3, 4, 12 and 13 the leadframe carrier coupler assembly 80 will be described. The function of the leadframe carrier coupler assembly is to allow the leadframe carrier to be moved through the test probe head as will be described in the following. A leadframe carrier coupler assembly 80 is provided at each end of the leadframe carrier main body 20 and as they are identical only one will be described. The coupler assembly 80 comprises a coupler rod 81 that is fixed through isolation rings 82 provided at each end of coupler rod 81 to coupling blocks 83. Cap screws 84, two to each coupling block 83, are inserted through the underside of each coupling block to enable the blocks 83, and thus the entire leadframe carrier coupler assembly 80, to be secured to the underside of the main body 20 of the leadframe carrier. Isolation rings serve to ensure that the main body 20 is not electrically connected to any other part of the apparatus through engagement with the claw members.

Figure 17:
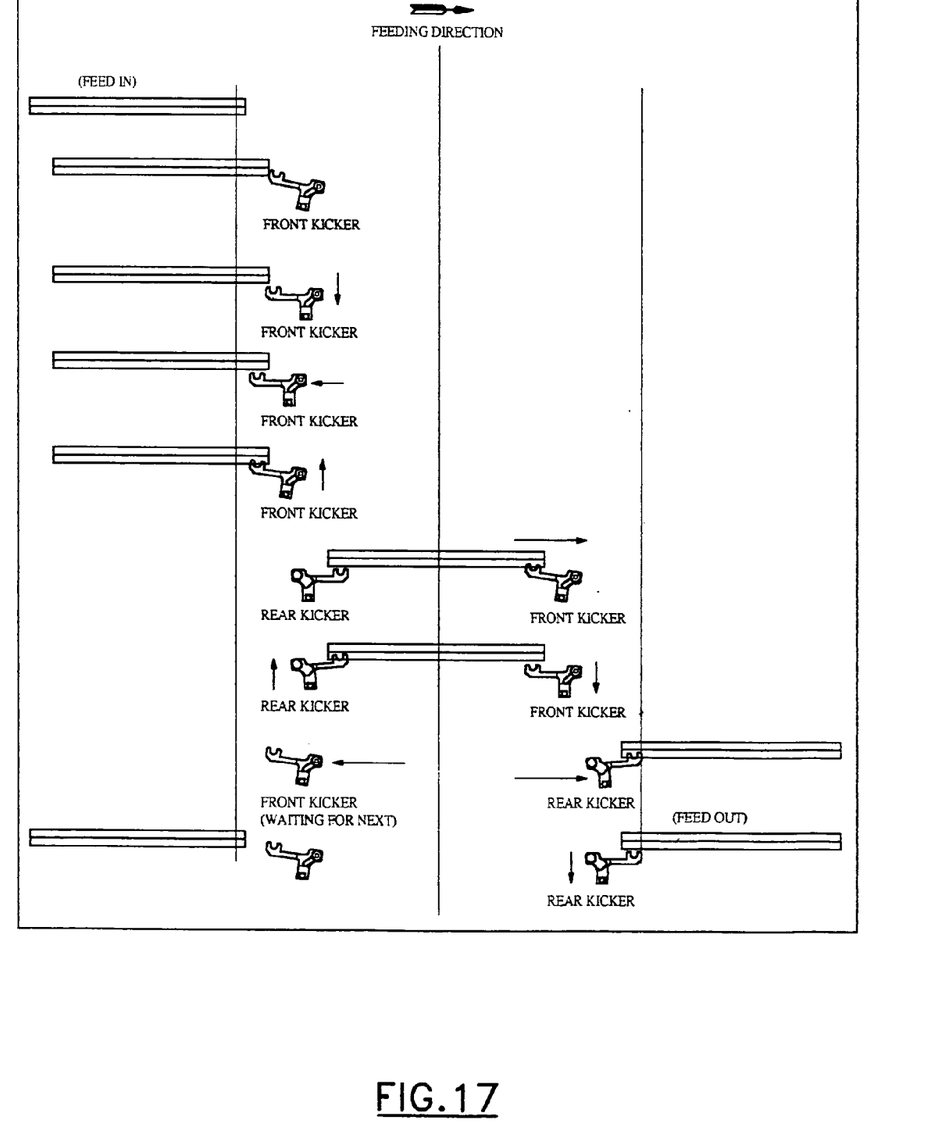
FIG. 17 illustrates the sequence of steps as the claw members transfer a carrier to a test probe head.

Returning to a consideration of FIG. 1 it will be seen that a leadframe carrier is moved towards the test probe head 1 by means of a conveyor belt 3. Immediately upstream of the test probe head 1 is provided an up/down platform 9 onto which the leadframe carrier 2 is moved by the conveyor belt 3. Formed with the test probe head 1 are first and second claw members 10,11. When the leadframe carrier 2 is moved onto the up/down platform 9, the first claw member engages the upstream coupler assembly 80 by engaging coupler rod 81 and moves the leadframe carrier onto the test probe head by movement of the first claw member for substantially the length of the test probe head. Subsequently the second claw member engages the coupling rod 81 of the rearmost coupling assembly 80 to continue the movement while the first claw member releases its engagement of the foremost coupling assembly and prepares to engage a subsequent leadframe carrier. This sequence is shown schematically in FIG. 17.

Figure 16:
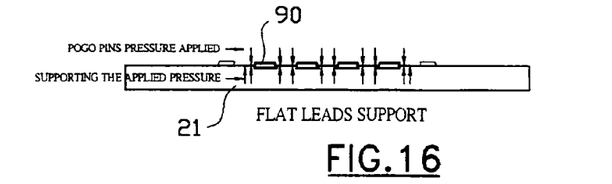
FIG. 16 illustrates how the embodiment of the invention supports leads extending from a semiconductor device during testing.

FIG. 16 illustrates an advantage of this embodiment of the present invention in terms of the support that is provided by the leadframe support member 21. FIG. 16 shows simply a number of devices supported on leadframe support member with the main body 20 not shown for clarity. FIG. 16 shows in section four electronic semiconductor devices 90 received in the grooves 22. These devices 90 may be formed as part of four single row leadframes, or one leadframe having four rows, or two leadframes each having two rows and so on. The leadframe is held firmly in place by the gripping means 23 provided on either side. It should be noted that the leads extending from the devices 90 are supported by the surface of the leadframe support member 21. When the devices undergo test, the test probes within the test probe head will engage the leads and exert a downward pressure indicated by the downwardly pointing arrows in FIG. 16. This downward pressure is, however, fully supported by the leadframe support member 21 as illustrated by the upward arrows in FIG. 16.

The leadframe support member 21 may be made of any non-conducting material. Preferably, however it is made of an insulating high-resistivity material. An example of a suitable material is Torlon provided by Amoco Polymers Inc. The main body 20 is preferably made of a conducting material and is grounded through guide holes 32 provided on either side of the main body 20 into which are located metal-plugs that align the main body 20 with the source of compressed air to air inlet 60 and simultaneously function to ground the main body 20.

The invention claimed is:

1. Apparatus for supporting, during a testing operation, a leadframe formed with at least one row of non-singulated semiconductor devices, comprising a main body and a leadframe support member, the leadframe support member being connected to the main body; wherein said leadframe support member is formed with at least one groove for receiving said semiconductor devices such that, during the testing operation, test probes from a test probe head are electrically connected with leads extending from said semiconductor devices, the leads resting upon a surface of said support member.

2. Apparatus as claimed in claim 1 wherein said leadframe support member is formed with a plurality of parallel grooves.

3. Apparatus as claimed in claim 2, wherein each groove receives a plurality of semiconductor devices.

4. Apparatus as claimed in claim 1 further comprising means for releasably gripping a said leadframe so as to hold said leadframe in place.

5. Apparatus as claimed in claim 4 wherein said gripping means comprises a pair of gripping members disposed on respective sides of said groove.

6. Apparatus as claimed in claim 5 wherein means are provided for moving said gripping members into and out of engagement with said leadframe.

7. Apparatus as claimed in claim 6 wherein said moving means is actuated by compressed air.

8. Apparatus as claimed in claim 7 wherein a plurality of pairs of gripping members are provided, and wherein said compressed air is provided directly to one said pair and is distributed to the other said pairs by an air distribution assembly formed in the main body.

9. Apparatus as claimed in claim 4 wherein said gripping means extends through apertures formed in said leadframe support member.

10. Apparatus as claimed in claim 1 wherein said main body is formed with locating pins for locating the leadframe support member on the main body.

11. Apparatus as claimed in claim 1 wherein said main body is formed of a conducting material and includes holes for providing an electrical grounding.

12. Apparatus as claimed in claim 1 wherein the leadframe support member is formed of a high resistivity electrically insulating material.

13. Apparatus as claimed in claim 1 wherein said main body is provided with identification means.

14. Apparatus as claimed in claim 1, wherein each groove receives a plurality of semiconductor devices.

15. Apparatus as claimed in claim 1, wherein the main body member includes a recess and the leadframe support member is located in the recess.

16. Apparatus for supporting during a testing operation a leadframe formed with at least one row of non-singulated semiconductor devices, comprising a main body, a leadframe support member, the leadframe support member being connected to the main body, wherein said leadframe support member is formed with at least one groove for receiving said semiconductor devices such that in use, test probes from a test probe head are electrically connected with leads extending from said semiconductor devices, the leads lying on a surface of said support member, and means for coupling said main body with a transport mechanism.

17. Apparatus as claimed in claim 16 wherein the means for coupling include a coupler rod having two ends, each end of the connector rod is coupled to a coupling block, and each coupling block is secured to the main body.

* * * * *